(12) United States Patent
Dubin et al.

(10) Patent No.: US 7,755,082 B2
(45) Date of Patent: Jul. 13, 2010

(54) FORMING SELF-ALIGNED NANO-ELECTRODES

(75) Inventors: Valery M. Dubin, Portland, OR (US); Swaminathan Sivakumar, Portland, OR (US); Andrew A. Berlin, San Jose, CA (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 239 days.

(21) Appl. No.: 11/983,260

(22) Filed: Nov. 8, 2007

(65) Prior Publication Data

US 2008/0116439 A1    May 22, 2008

Related U.S. Application Data

(62) Division of application No. 10/819,790, filed on Apr. 7, 2004, now Pat. No. 7,312,155.

(51) Int. Cl.
*H01L 29/08* (2006.01)
*H01L 35/24* (2006.01)
*H01L 51/00* (2006.01)

(52) U.S. Cl. .................. 257/40; 257/632; 257/E51.04; 977/742

(58) Field of Classification Search .................. 257/40, 257/632, E51.04; 977/742
See application file for complete search history.

(56) References Cited

U.S. PATENT DOCUMENTS

| | | | |
|---|---|---|---|
| 6,979,947 B2 * | 12/2005 | Yaniv et al. .................. 313/495 |
| 7,452,828 B2 * | 11/2008 | Hirakata et al. .............. 438/780 |
| 2004/0007955 A1 * | 1/2004 | Yaniv et al. .................. 313/309 |
| 2004/0036400 A1 * | 2/2004 | Simon et al. ................. 313/311 |
| 2004/0152240 A1 * | 8/2004 | Dangelo ...................... 438/122 |
| 2005/0001529 A1 * | 1/2005 | Kang et al. .................. 313/310 |
| 2005/0127030 A1 * | 6/2005 | Watanabe et al. ............. 216/41 |
| 2006/0091557 A1 * | 5/2006 | Sakamoto et al. ........... 257/774 |
| 2009/0045473 A1 * | 2/2009 | Jaiprakash et al. .......... 257/415 |
| 2009/0181535 A1 * | 7/2009 | Sakamoto et al. ........... 438/618 |

\* cited by examiner

*Primary Examiner*—Ngan Ngo
(74) *Attorney, Agent, or Firm*—Trop, Pruner & Hu, P.C.

(57) ABSTRACT

A nano-electrode or nano-wire may be etched centrally to form a gap between nano-electrode portions. The portions may ultimately constitute a single electron transistor. The source and drain formed from the electrode portions are self-aligned with one another. Using spacer technology, the gap between the electrodes may be made very small.

3 Claims, 4 Drawing Sheets

FORMING SELF-ALIGNED NANO-ELECTRODES

CROSS-REFERENCE TO RELATED APPLICATIONS

This application is a divisional of U.S. patent application Ser. No. 10/819,790, filed Apr. 7, 2004 now U.S. Pat No. 7,312,155.

BACKGROUND

This invention relates generally to nanotechnology and to the fabrication of very small electronic devices.

In nanotechnology, very small electronic devices may be fabricated from physical parts. For example, a field effect transistor may be made of sources and drains fabricated from nano-wires such as carbon nanotubes.

Carbon nanotubes are graphene cylinders whose ends are closed by caps, including pentagonal rings. The nanotube is an hexagonal network of carbon atoms forming a seamless cylinder. These cylinders can be as little as a nanometer in diameter with lengths of tens of microns, in some cases. Depending on how they are made, the tubes can be multiple walled or single walled.

The nano-wires may be utilized to form the source and drain of a transistor. However, the source and drain must be aligned with one another and a channel must be defined between the carbon nanotubes. The channel or gap between the two nano-wires is very small.

Thus, there is a need for better ways to make nano-devices using nano-wires having relatively small nano-gaps between the nano-wires.

DETAILED DESCRIPTION

Figure 1:
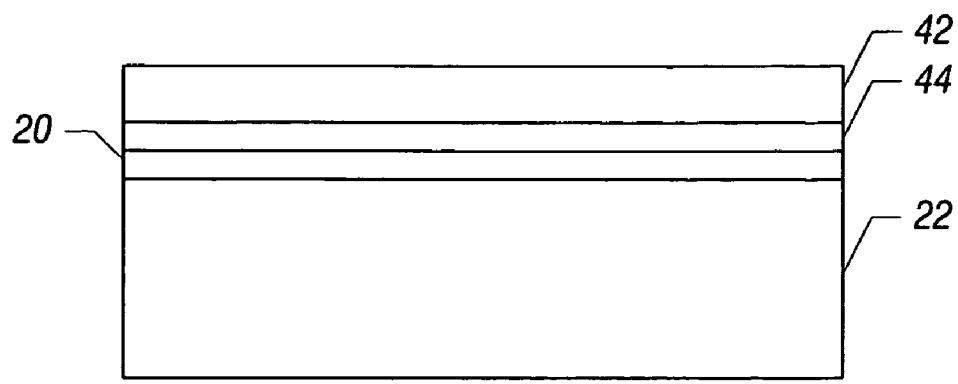
FIG. 1 is an enlarged, cross-sectional view at an early stage of manufacture in accordance with one. embodiment of the present invention.
Figure 2:
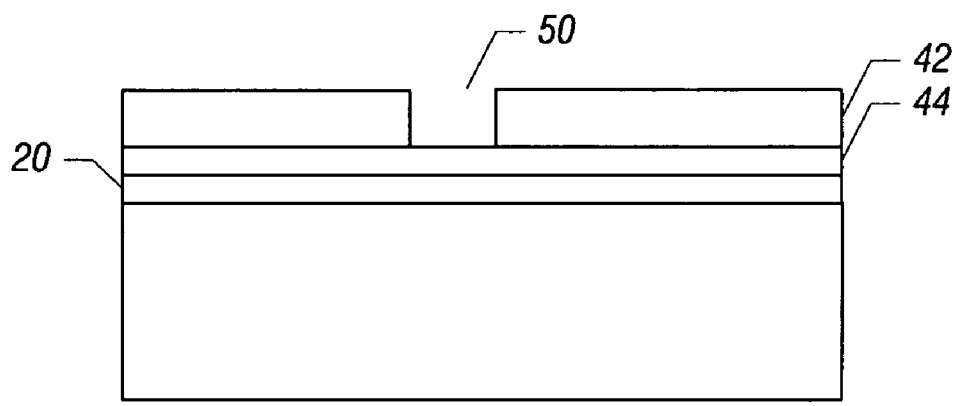
FIG. 2 is an enlarged, cross-sectional view at a subsequent stage of manufacture in accordance with one embodiment of the present invention.

As shown in FIG. 1, nano-devices may be fabricated over a silicon substrate 22 with nano-electrodes 20 formed thereover. A nano-electrode is a conductive element having a diameter of less than 100 nanometers. The nano-electrodes 20 may be covered by an etch stop layer 44 and a dielectric layer 42. The dielectric layer 42 may be patterned and etched to form the aperture 50 which extends through the dielectric layer 42 and stops at the etch stop layer 44, as shown in FIG. 2. In one embodiment, the aperture 50 may be patterned using photoresist.

Figure 3:
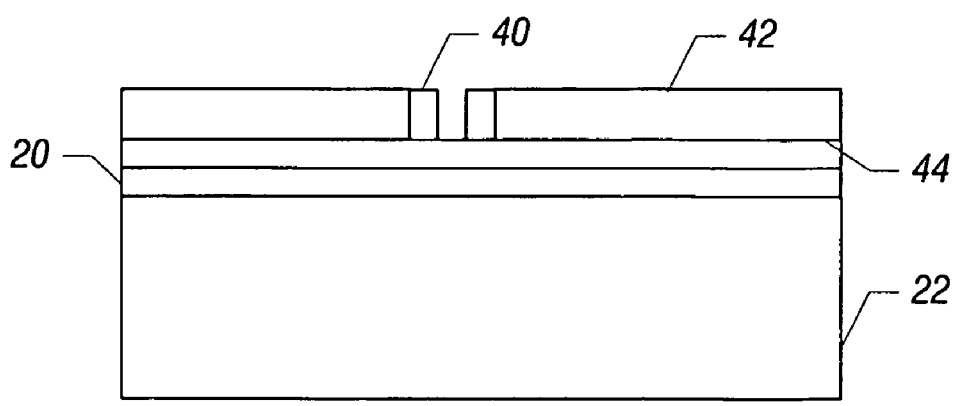
FIG. 3 is an enlarged, cross-sectional view at a subsequent stage of manufacture in accordance with one embodiment of the present invention.

Thereafter, as shown in FIG. 3, sidewall spacers 40 may be applied, in one embodiment, to the aperture 50. The side wall spacers may be formed using conventional technology. The spacers 40 may be formed of any sufficiently etch resistant material.

Figure 4:
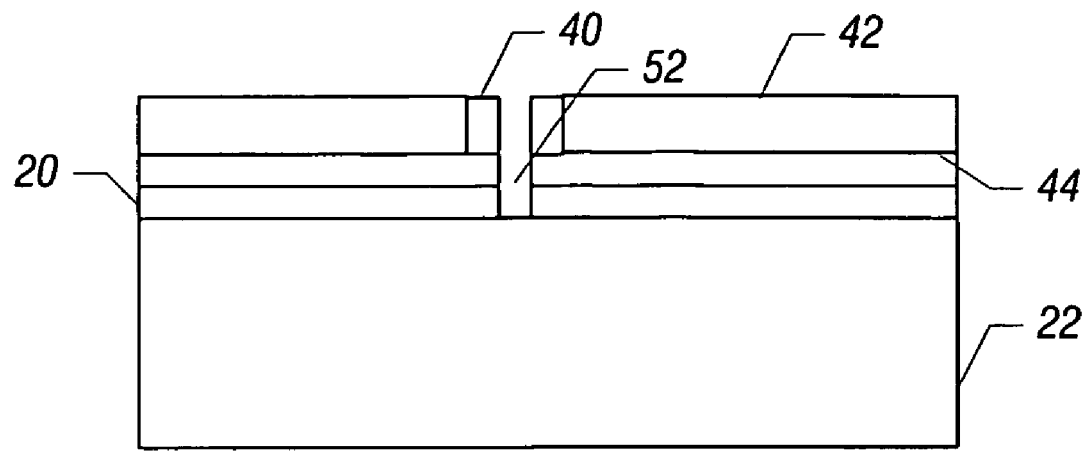
FIG. 4 is an enlarged, cross-sectional view at a subsequent stage of manufacture in accordance with one embodiment of the present invention.

Referring to FIG. 4, using the spacers 40 as an etch mask, the gap 52 may be formed through the etch stop layer 44 and the nano-electrodes 20. As a result, two nano-electrode portions are formed on either side of the gap 52, forming self-aligned nano-electrodes 20. Thereafter, the gap 52 may be cleaned to remove etch residues.

Figure 5:
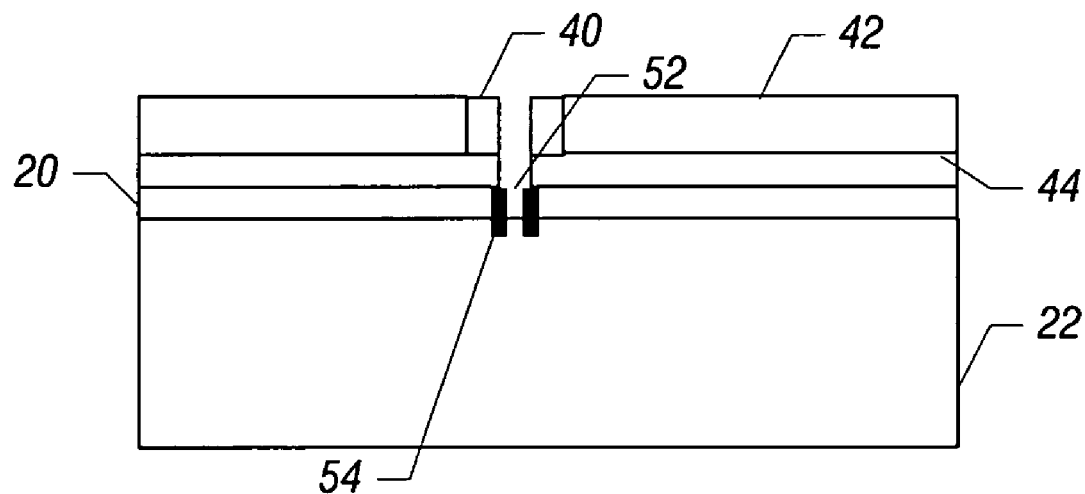
FIG. 5 is an enlarged, cross-sectional view at a subsequent stage of manufacture in accordance with one embodiment of the present invention.

As shown in FIG. 5, the gap 52 may be further narrowed by selective metal deposition, as indicated as 54, over the nano-electrodes 20. In one embodiment, electroless plating of gold, silver, platinum, lead with ruthenium, osmium, iridium, copper, cobalt, nickel, or iron alloys may be utilized. Narrowing of the gaps 52 may be self-terminated if absorbed layers of organics are used on the surface of metals during plating. The deposition 54 may be polyethylene glycol-type with chlorine, as well as disulfides on copper or thiol-based organics on gold in other embodiments.

In one embodiment, the nano-electrodes 20 can be formed by a subtractive process, such as lithography, etching, and cleaning operations, or vapor deposition on patterned catalytic particles, such as gold. The nano-electrodes 20 may also be formed of metal nano-wires, such as copper, nickel, cobalt, gold, lead, aluminum, titanium, tungsten, tantalum, or ruthenium alloys in a damascene process. Metal nano-wires may also be formed by a subtractive process.

The nano-electrodes 20 may also be nanotubes, such as carbon nanotubes, including single wall and multiple wall nanotubes, may be formed on the substrate surface by dispensing a solution containing the carbon nanotubes, followed by alignment or by chemical vapor deposition such as carbon monoxide decomposition on patterned catalytic particles, such as cobalt, nickel, iron, molybdenum, and alloys.

Figure 6:
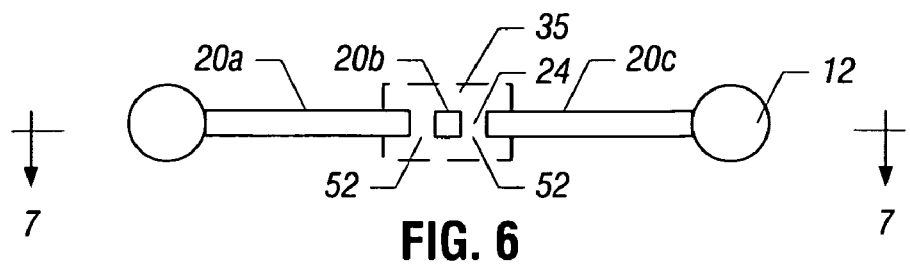
FIG. 6 is an enlarged, cross-sectional view taken generally along the line 6-6 in FIG. 7 in one embodiment of the present invention.

Referring to FIG. 6, in accordance with another embodiment of the present invention, the nano-electrodes 20 may actually be separated into three parts 20a, 20b, and 20c, by any of the processes described above, forming a pair of nano-gaps 52 on either side of the portion 20b. In one embodiment, a single mask with two exposures may be utilized. In another embodiment, a nano-gap 52 with a reentrant profile may be formed between two electrodes followed by a nano-dot deposition and lift off or selective etching. If an electron is trapped in a quantum nano-wire or nano-tube, current will not flow due to Coulomb blockage.

The electron flow can be modulated by a gate 35. While the gate 35 is shown below the nano-gaps 52, other orientations may also be used.

As a result of Coulomb blockage, electrons tunnel one by one through the nano-gaps 52. The conductance versus gate voltage dependence is in the form of a series of sharp peaks. In effect, a single electron transistor is formed which, among other things, may be an extremely sensitive electrometer.

Figure 7:
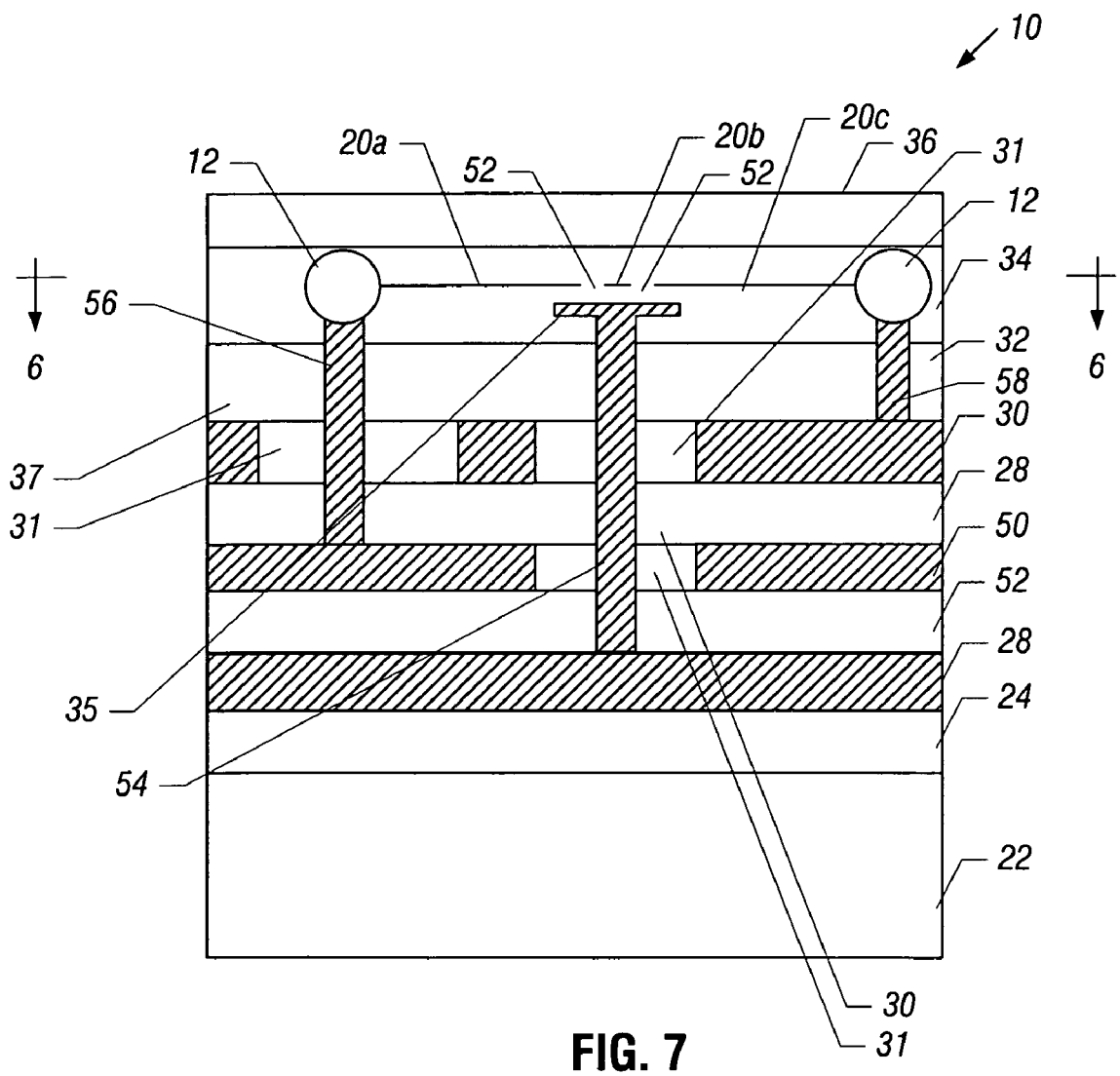
FIG. 7 is a vertical, cross-sectional view taken generally along the line 7-7 in FIG. 6 in accordance with one embodiment of the present invention.

The structure shown in FIG. 6 may be covered with an optical layer 36 as shown in FIG. 7. Below the optical layer it may be a layer 34 in which a pair of contacts 12 are formed. The contacts 12 electrically connect to the nano-electrodes 20, including the portions 20a, 20b, and 20c. The gate electrode 35 may be formed below the nano-gaps 52. The gate electrode 35 may be coupled by a via 54 down to a conductive layer 28. The contacts 12 may be coupled by vias 56 or 58 to a conductive layer 30 or a conductive layer 50 as the case may be. The conductive layers 50, 28, and 30 may be electrically isolated from one another by insulators 28 and 52. Thus, for example, the conductive via 56 extends through an insulator 31 and the conductive layer 50 down to a conductive layer 50. The conductive layer 28 is isolated by the insulating layer 52 from the conductive layer 50. The conductive layer 50 connects to the via 56 which connects, in turn, to one of the contacts 12 coupled to the nano-electrode 20a. The contact 12 coupled to the nano-electrode 20c is coupled to the conductive layer 30 which is insulated from the via 56 by way of the insulator 31.

Thus, separate signals can be placed on each of the contacts 12 and on the gate 35 in order to control the flow of single electrons within the nano-gaps 52. In this embodiment, the nano-gaps 52 may be basically filled in by the material forming the insulative layer 34. The electrodes 20 may be self-aligned with one another and may be very tightly spaced by the nano-gaps 52. Thus, in one embodiment, quantum nanotubes on the order of 0.8 millimeters in diameter with Coulomb blockage may be fabricated from the same nanotubes in a fashion described above. Single electron transistors may be used in memory sensor arrays and may be programmable with selective writing, selective access, and selective readout.

Figure 8:
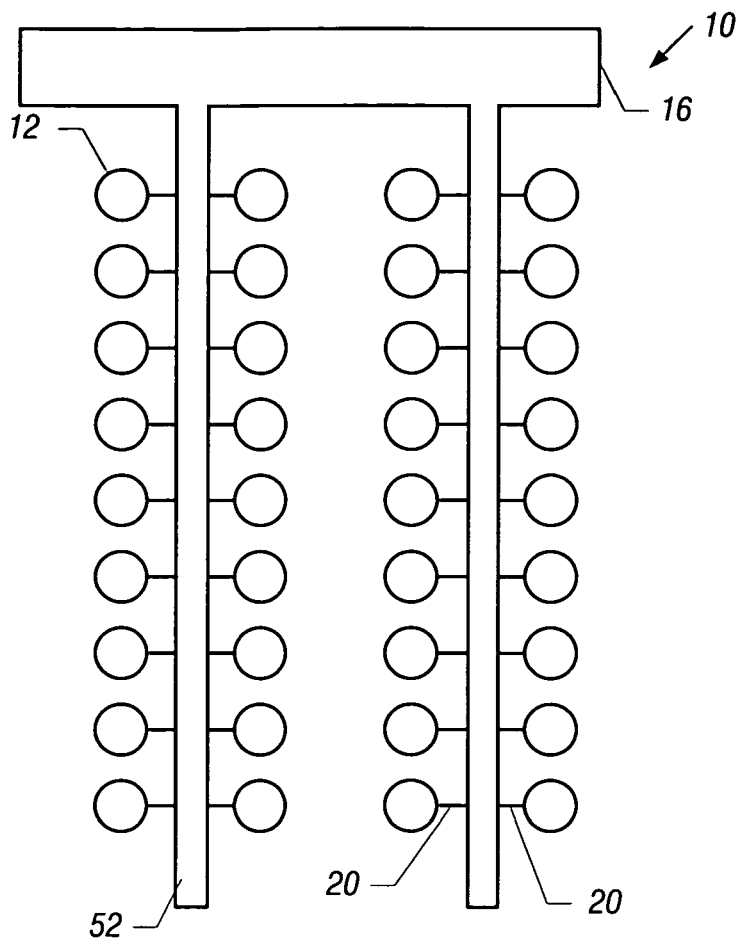
FIG. 8 is a cross-sectional view taken generally along the line 1-1 in FIG. 9.

Referring to FIG. 8, a manifold 16 may be coupled to a pair of nano-gaps 52. The manifold 16 may store an analyate which fills the nano-gaps 52. The nano-gaps 52 separate a pair of spaced nano-electrodes 20, which in one embodiment may be formed of carbon nanotubes. A series of contacts 12 are coupled to each electrode 20.

The nano-gap 52 forms a channel of a conductivity detector which can be used to flow chemicals and biological species, such as deoxyribonucleic acid (DNA), protein, and detect them through nano-electrodes 20.

Figure 9:
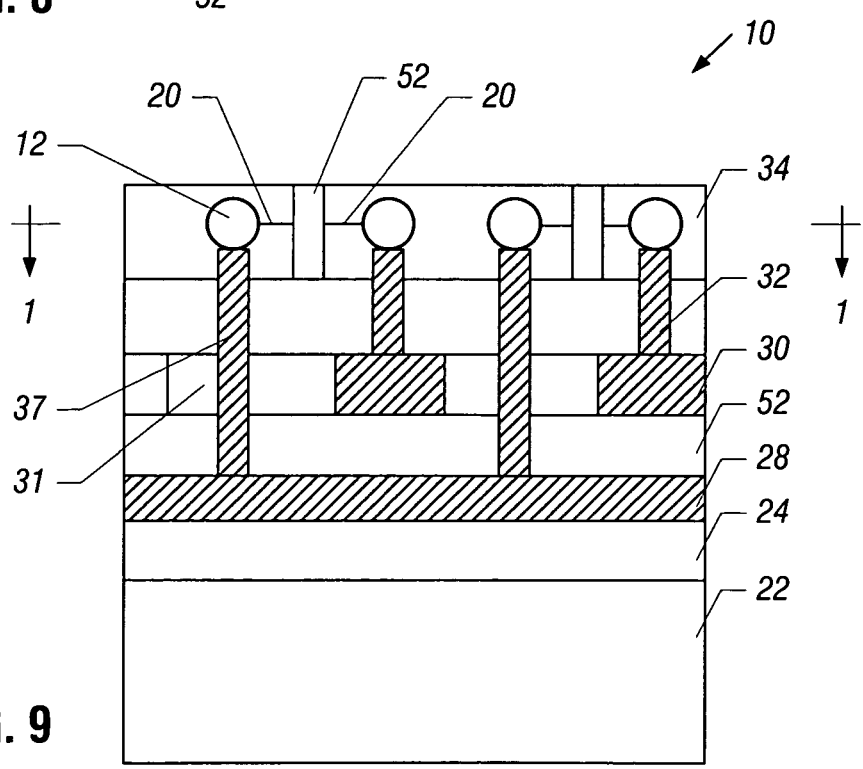
FIG. 9 is an enlarged, cross-sectional view taken vertically through FIG. 8.

Referring to FIG. 9, the contacts 12 are formed in a dielectric layer 34. Each contact 12 may be coupled to a via 37 or 32, which may be coupled to a conductive line 28 or 30. In one embodiment, the lines 30 extend into the page and the lines 28 extend across the page to form a transverse array of rows and columns. The lines 28 and 28 may be separated by a nano-gap 52 and the individual lines 30 may be separated by a dielectric layer 31. A dielectric layer 24 may be provided over a memory array 22 in one embodiment of the present invention.

In one embodiment, an array of memory cells with two nano-wire electrodes 20 and a nano-gap 52 between them may be utilized. The manifold 16 connects the nano-gaps 52 and may also serve as a nano-fluidic and electrophoresis channel.

As one example, the structure shown in FIGS. 8 and 9 may be used as a memory sensor array for a bio chip. Deoxyribonucleic acid (DNA) may be extracted from the cell and purified. The DNA may be fragmented down to 20 to 30 bases, with a length of 0.3 nanometers per base, and a maximum 100 bases. An automated PCR may be used with a desktop computer or manual sample preparation.

The manifold 16 and nano-gaps 52 may be filled with phosphate buffer solution by capillary force. A sample of target DNA fragments may be added to the manifold 16. The target DNA may be stretched by shear strength and separated by size in the manifold 16 by using electrophoresis. For example, a net of 1 negative electron charge per base from the phosphate backgrounds and less than 1 micrometer per second velocity may be achieved.

A target DNA may be attracted inside the nano-fluidic channel by applying potentials to channel electrodes 20. Target DNA may be selectively immobilized on nano-electrodes 20 using a label and DNA probe by hybridization. The DNA probes may have labels and can be selectively attached by a nano-electrode 20 using selective access/charge, while protecting other electrodes by charge. As another example, steptavidin can form a SAS layer and biotin with a DNA probe attached selectively with an electrical signal to electrodes. Electrode materials may be metals, such as tantalum, gold, copper, aluminum, ruthenium, or titanium nitride that are coated with other metals and dielectrics. The dielectrics may be silicon dioxide or SiCN to avoid electrolysis.

The reaction between the exposed nano-electrodes and the analyate in the nano-gaps 20 may be detected by a single electron switch acting as an electrometer. In other words, the chemical activity at the electrodes 20 may be secured. This arrangement may then function as a bio sensor that may be more accurate because of the precise control over the nano-gaps 52.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
   a carbon nanotube formed over a substrate; and
   a dielectric layer formed over said carbon nanotube, said dielectric layer having an aperture formed therein, wherein said dielectric layer includes a metal sidewall on each side of said aperture.

2. The structure of claim 1 including a pair of apertures spaced along the length of said carbon nanotube.

3. The structure of claim 1 including a plurality of generally parallel carbon nanotubes formed over a substrate and a single aperture through a dielectric layer over all of said carbon nanotubes.

* * * * *